(12) United States Patent
Takamatsu et al.

(10) Patent No.: US 8,748,891 B2
(45) Date of Patent: Jun. 10, 2014

(54) MANUFACTURING PROCESS OF LIQUID CRYSTAL DISPLAY DEVICE, AND LIQUID CRYSTAL DISPLAY DEVICE

(75) Inventors: Hideaki Takamatsu, Kanagawa (JP); Fumihiko Matsuno, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 439 days.

(21) Appl. No.: 12/409,914

(22) Filed: Mar. 24, 2009

(65) Prior Publication Data

US 2009/0242885 A1    Oct. 1, 2009

(30) Foreign Application Priority Data

Mar. 25, 2008  (JP) .................................. 2008-77894

(51) Int. Cl.
  *H01L 29/04*   (2006.01)
  *H01L 29/10*   (2006.01)
  *H01L 31/00*   (2006.01)

(52) U.S. Cl.
  USPC .. 257/59; 438/30; 257/E29.273; 257/E21.412

(58) Field of Classification Search
  USPC ....................... 257/59, E21.412, 72, E29.117, 257/E29.273, E21, 413, E21.414, E21.499, 257/E21.535, E21.001; 438/30, 149, 164; 349/155, 156
  See application file for complete search history.

(56) References Cited

U.S. PATENT DOCUMENTS

| | | | |
|---|---|---|---|
| 5,739,880 A * | 4/1998 | Suzuki et al. ................. | 349/110 |
| 6,049,365 A * | 4/2000 | Nakashima ..................... | 349/42 |
| 6,204,907 B1 | 3/2001 | Hiraishi et al. | |
| 6,429,917 B1 | 8/2002 | Okamoto et al. | |
| 6,441,879 B2 | 8/2002 | Hiraishi et al. | |
| 7,709,843 B2 * | 5/2010 | Yamazaki et al. .............. | 257/72 |
| 2003/0103181 A1 | 6/2003 | Imayama et al. | |
| 2005/0045891 A1 * | 3/2005 | Yamazaki et al. .............. | 257/72 |
| 2006/0001789 A1 * | 1/2006 | Ahn ................................ | 349/42 |
| 2006/0202615 A1 * | 9/2006 | Murakami et al. ........... | 313/506 |
| 2007/0051952 A1 * | 3/2007 | Yamazaki et al. .............. | 257/59 |
| 2008/0105875 A1 * | 5/2008 | Maekawa et al. .............. | 257/72 |
| 2008/0143653 A1 * | 6/2008 | Shishido ........................ | 345/78 |

(Continued)

FOREIGN PATENT DOCUMENTS

| | | |
|---|---|---|
| JP | 9-90373 | 4/1997 |
| JP | 2000-250066 | 9/2000 |

(Continued)

OTHER PUBLICATIONS

Japanese Official Action—2008-077894—Aug. 15, 2012.

(Continued)

*Primary Examiner* — Daniel Luke
*Assistant Examiner* — Latanya N Crawford
(74) *Attorney, Agent, or Firm* — Young & Thompson

(57) ABSTRACT

A manufacturing process of an LCD device of the invention includes forming a first substrate provided with a pixel part with thin film transistors and a seal portion arranged around the pixel part, forming a second substrate opposed to the first substrate, filling a liquid crystal layer between the first substrate and the second substrate, and adhering the first substrate to the second substrate with a sealant provided for the seal portion, wherein the forming the first substrate includes forming a semiconductor layer composing the thin film transistor, forming in the seal portion a semiconductor connection layer made of a same material as the semiconductor layer, and forming an organic interlayer insulating film, wherein the forming the semiconductor layer and the forming the semiconductor connection layer are performed in the same step.

19 Claims, 12 Drawing Sheets

(56) References Cited

U.S. PATENT DOCUMENTS

2008/0198287 A1* 8/2008 Kim et al. .................... 349/42
2009/0033818 A1* 2/2009 Nakajima et al. ............ 349/43

FOREIGN PATENT DOCUMENTS

| JP | 2000-347173 | 12/2000 | | |
| JP | 2001053283 A | * 2/2001 | ............ | H01L 29/786 |
| JP | 2002-328395 | 11/2002 | | |
| JP | 2003-167258 | 6/2003 | | |
| JP | 2007-304452 | 11/2007 | | |

OTHER PUBLICATIONS

Japanese Official Action—2013-111356—Feb. 5, 2014.

\* cited by examiner

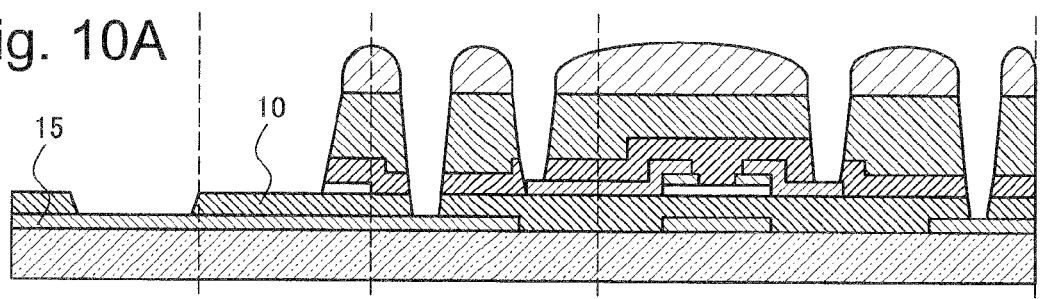
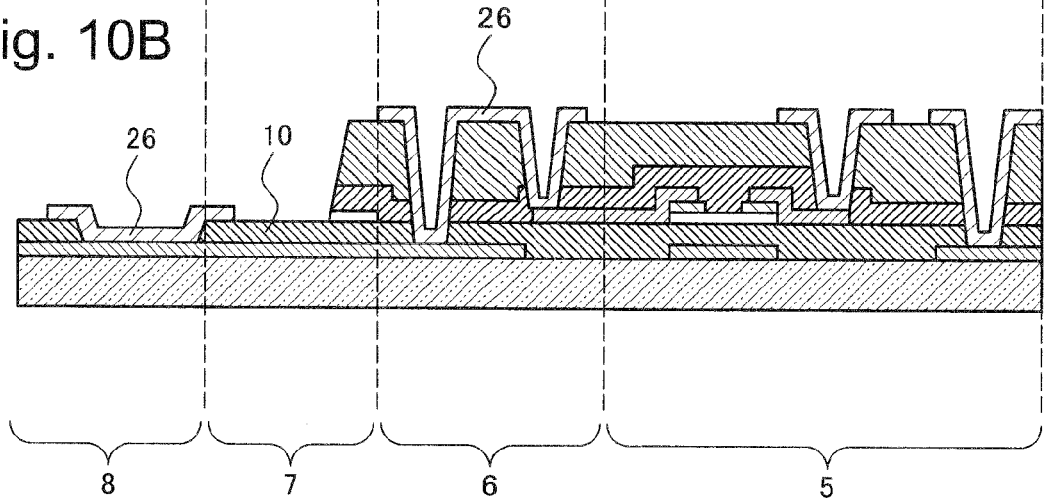

MANUFACTURING PROCESS OF LIQUID CRYSTAL DISPLAY DEVICE, AND LIQUID CRYSTAL DISPLAY DEVICE

INCORPORATION BY REFERENCE

This application is based upon and claims the benefit of priority from Japanese Patent Application No. 2008-077894, filed on Mar. 25 2008, the disclosure of which is incorporated herein in its entirety by reference.

BACKGROUND OF THE INVENTION

1. Technical Field

The present invention relates to a manufacturing process of a liquid crystal display (LCD) device and an LCD device, and particularly relates to a manufacturing process including a step for sealing a liquid crystal layer with a sealant and a structure of a seal portion thereof.

2. Background Art

In recent years, an LCD device is widely used as a high-resolution display device. This LCD device includes two substrates. The one has switching elements such as thin film transistors (TFTs) (hereinafter, referred to as a TFT substrate) and the other has a color filter and a black matrix (hereinafter, referred to as a color filter substrate). In this LCD device, a liquid crystal material is sandwiched between the TFT substrate and the color filter substrate. These substrates are adhered by using a sealant on a periphery thereof, and a liquid crystal layer is sealed.

In a general LCD device, the sealant adheres to an inorganic protective insulating film extending to the periphery of the TFT substrate. In recent years, in order to improve an aperture ratio of a TFT substrate, an LCD device is put to practical use in which an organic interlayer insulating film is formed on an inorganic protective insulating film However, an adhesive force between an organic interlayer insulating film and a sealant decreases compared with one between an inorganic protective insulating film and a sealant. Therefore the sealant is designed to be arranged on the inorganic protective insulating film by adding a process of removing the organic interlayer insulating film on the seal portion of the TFT substrate. In this way, an improvement of adhesiveness is achieved.

An example of an LCD device having an organic interlayer insulating film is disclosed in Japanese Patent Application Laid-Open No. 2003-167258. The LCD device described in this gazette is shown in FIG. 11. FIG. 11A is a cross sectional view of an outer peripheral part thereof, and FIG. 11B is a cross sectional view of a pixel part. As shown in FIG. 11B, the TFT structure of this LCD device is a structure called a top gate type or a planar type. In the top gate type (the planer type) TFT structure, a polysilicon semiconductor layer 32, a gate insulating film 33, and a gate wiring 34 are formed in this order on a glass substrate 31. An inorganic protective insulating film 35 and an organic interlayer insulating film 36 are formed in this order on an upper surface of the gate wiring 34. Accordingly, by removing only two layers of the organic interlayer insulating film 36 and the inorganic protective insulating film 35 using an etching step, a contact hole can be formed. At that time, in a seal portion in which a sealant 37 is formed, since the layer structure is identical with that of the pixel part, the organic interlayer insulating film 36 and the inorganic protective insulating film 35 in the seal portion are also removed similarly. However, an inorganic interlayer insulating film 38 formed thereunder remains without being removed. Accordingly, the gate wiring 34 formed under the inorganic interlayer insulating film 38 can not be exposed in the seal portion during a contact hole formation process.

SUMMARY

An exemplary object of the present invention is to provide a manufacturing process of a high reliable LCD device having strong adhesive force between a TFT substrate and a sealant without additional process, and this LCD device.

A manufacturing process of an LCD device according to an exemplary aspect of the present invention includes forming a first substrate provided with a pixel part with thin film transistors and a seal portion arranged around the pixel part, forming a second substrate opposed to the first substrate, filling a liquid crystal layer between the first substrate and the second substrate, and adhering the first substrate to the second substrate with a sealant provided for the seal portion, wherein the forming the first substrate includes forming a semiconductor layer composing the thin film transistor, forming in the seal portion a semiconductor connection layer made of a same material as the semiconductor layer, and forming an organic interlayer insulating film, wherein the forming the semiconductor layer and the forming the semiconductor connection layer are performed in the same step.

An LCD device according to another aspect of the present invention includes a first substrate provided with a pixel part with thin film transistors and a seal portion arranged around the pixel part, a second substrate opposed to the first substrate, a liquid crystal layer filled between the first substrate and the second substrate, and a sealant provided for the seal portion in which the first substrate is adhered to the second substrate, wherein the first substrate includes an organic interlayer insulating film at least, the seal portion includes a semiconductor connection layer made of a same material as a semiconductor layer composing the thin film transistor, and the semiconductor connection layer is arranged in contact with the sealant.

BRIEF DESCRIPTION OF THE DRAWINGS

Exemplary features and advantages of the present invention will become apparent from the following detailed description when taken with the accompanying drawings in which:

FIGS. 10A and 10B are cross sectional views illustrating a manufacturing process of the TFT substrate according to the fourth exemplary embodiment of the present invention;

EXEMPLARY EMBODIMENT

Exemplary embodiments of the present invention will now be described in detail in accordance with the accompanying drawings.

Figure 1:
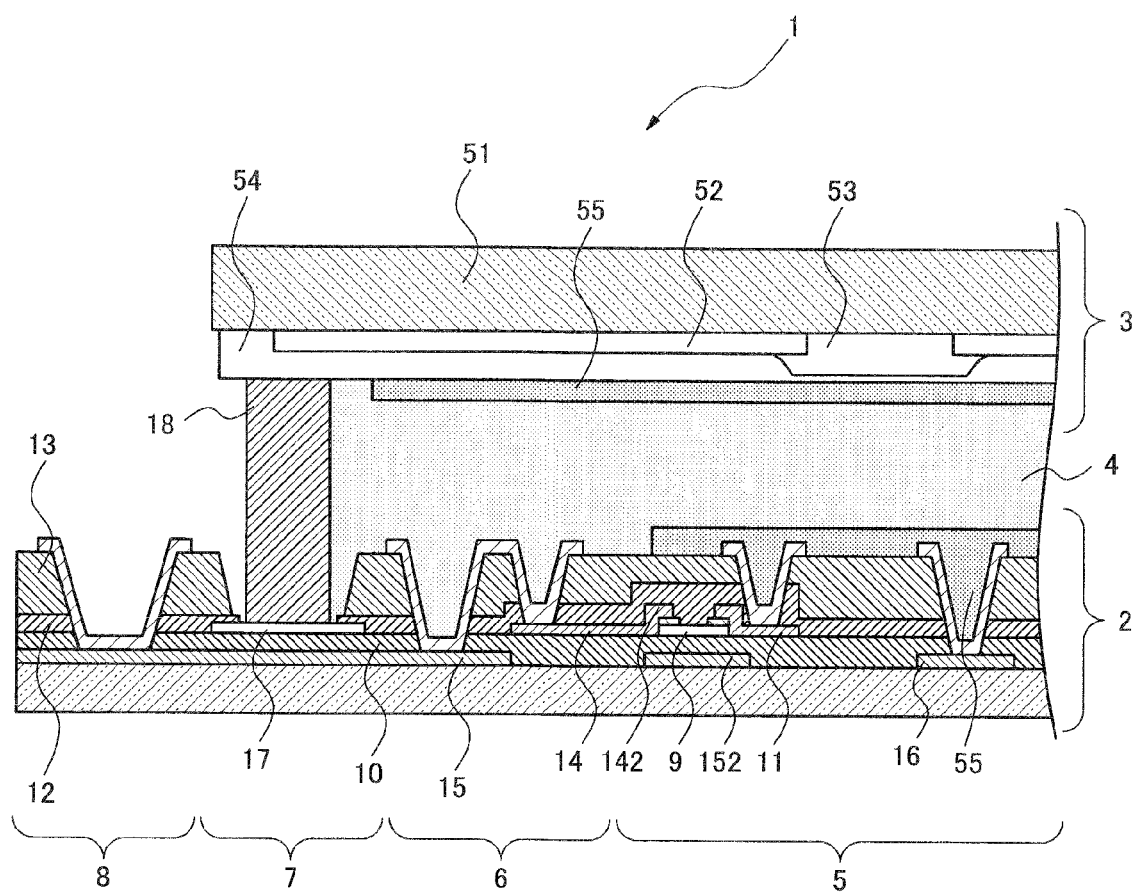
FIG. 1 is a cross sectional view of an LCD device according to a first exemplary embodiment of the present invention.

FIG. 1 is a cross sectional view of an LCD device according to a first exemplary embodiment of the present invention. As shown in FIG. 1, in an LCD device 1, a liquid crystal layer 4 is sandwiched between a TFT substrate 2 and a color filter substrate 3. The TFT substrate 2 includes a pixel part 5, a G/D conversion part 6 for connecting a drain wiring to a gate wiring which is used as a drain lead wiring, a seal portion 7, and a terminal portion 8.

In the pixel part 5, a thin-film transistor (TFT) is formed which includes a channel region consisting of an amorphous silicon (a-Si) film 9, a gate insulating film 10, a gate electrode 152, a source electrode 11, and a drain electrode 142. And protective insulating film 12 and organic interlayer insulating film 13 are formed all over the TFT substrate 2. In a contact region of the source electrode 11 and a drain wiring 14 connected to the drain electrode 142, the protective insulating film 12 and the organic interlayer insulating film 13 are removed. On the other hand, in a contact region of a common electrode 16 located in the same layer as a gate wiring 15 connected to the gate electrode 152, a gate insulating film 10 is also removed in addition to the protective insulating film 12 and the organic interlayer insulating film 13. That is, a contact hole is opened whose depth is different from that of the contact hole on the source electrode 11 and a drain wiring 14.

In the seal portion 7, a semiconductor connection layer 17 consisting of an amorphous silicon (a-Si) film is formed on the same layer as the channel region in the TFT. The protective insulating film 12 and the organic interlayer insulating film 13 on the semiconductor connection layer 17 are removed, and the semiconductor connection layer 17 formed on the gate insulating film 10 is exposed. The exposed semiconductor connection layer 17 is contacted with a sealant 18.

In the G/D conversion part 6, in order that the drain wiring 14 formed on the same layer as the channel region in the TFT will not be exposed in the seal portion 7, the drain wiring 14 is joined to the gate wiring 15.

A terminal portion 8 is a terminal for connecting the LCD device 1 to an external circuit, which is connected to the gate wiring 15.

On the other hand, the color filter substrate 3 opposed to the TFT substrate 2 includes a glass substrate 51, a black matrix (BM) 52 formed thereon, a color pixel 53, a flattening film 54 consisting of an organic material, and an alignment film 55. In the LCD device according to this exemplary embodiment, the TFT substrate 2 is adhered to the color filter substrate 3 by the sealant 18 arranged in the seal portion 7 located near the periphery of the TFT substrate 2. The liquid crystal layer 4 is filled between the TFT substrate 2 and the color filter substrate 3.

The sealant 18 is generally made of epoxy resin or the like. With respect to adhesive strength, one between the amorphous silicon (a-Si) film as a semiconductor material and the sealant 18 is the strongest, one between a transparent conductive film and the sealant 18 is the next strongest, and one between the organic interlayer insulating film 13 and the sealant 18 is the weakest. In this exemplary embodiment, since the semiconductor connection layer 17 made of an amorphous silicon (a-Si) film is formed in the region adhering to the sealant 18, the adhesive force between the sealant 18 and the TFT substrate 2 can be strengthened. Moreover, unlike an electrode layer made of a metallic material, the semiconductor material is not corroded by contacting with a sealant. Therefore, a connection part with the sealant 18 does not deteriorate with aging, and an LCD device with high reliability is obtained.

A manufacturing process of the TFT substrate 2 according to the first exemplary embodiment is described referring to FIGS. 2 to C.

Figure 2A:
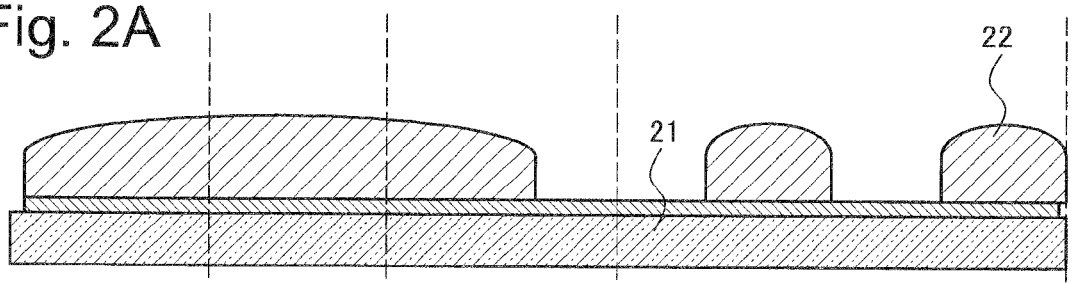
FIGS. 2A to 2C are cross sectional views illustrating a manufacturing process of a TFT substrate according to the first exemplary embodiment of the present invention.

First, as shown in FIG. 2A, a metal layer for the gate wiring 15 is formed on a glass substrate 21. As examples of metal, a pure metal, such as Cr, Al, Mo, Ti and Cu, or an alloy including these metals can be used. A laminated structure consisting of two or more kinds of such metal may be used. A metal evaporation process can be used for a film deposition process, more preferably a sputtering technique is used.

Figure 2B:
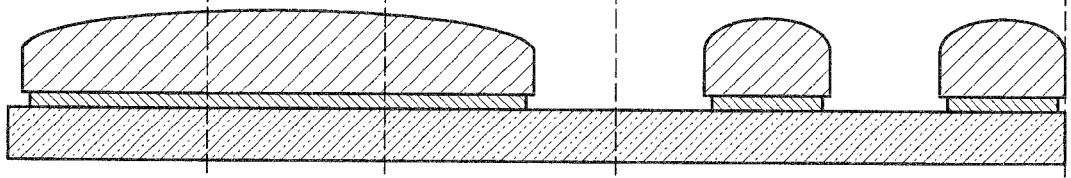
Figure 2C:
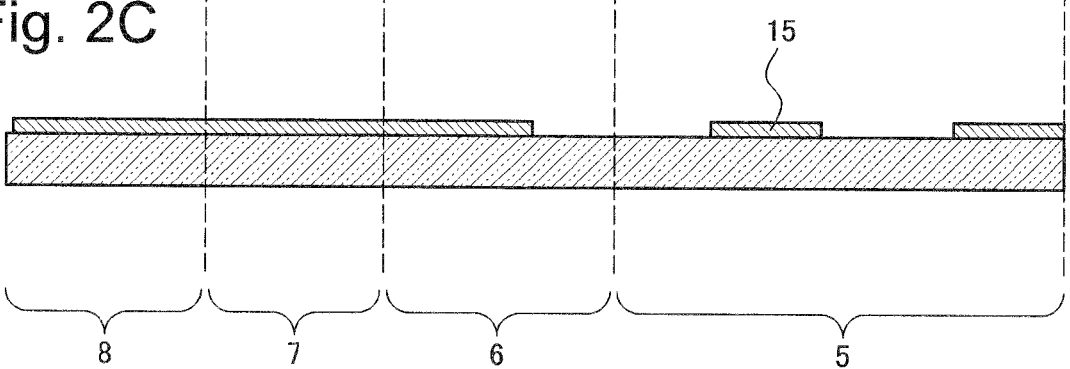

A resist layer 22 is formed into a prescribed pattern by means of a photolithography process (FIG. 2A). A pattern of the gate wiring 15 is formed by etching the metal layer using this resist layer 22 as a mask (FIG. 2B). Then the resist layer 22 is removed (FIG. 2C).

Figure 3A:
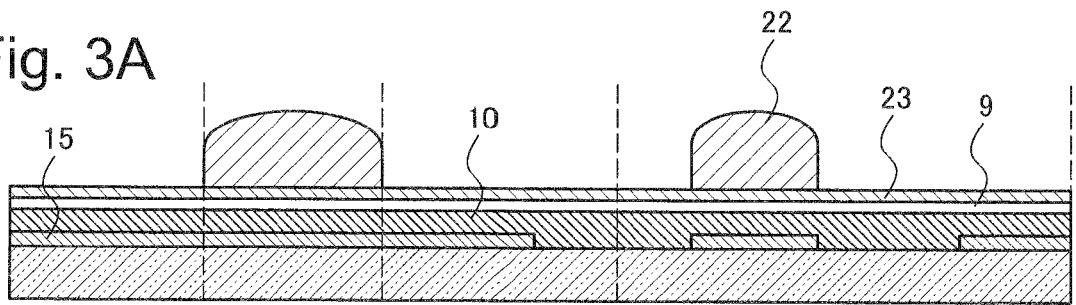
FIGS. 3A to 3C are cross sectional views illustrating a manufacturing process of the TFT substrate according to the first exemplary embodiment of the present invention.
Figure 3B:
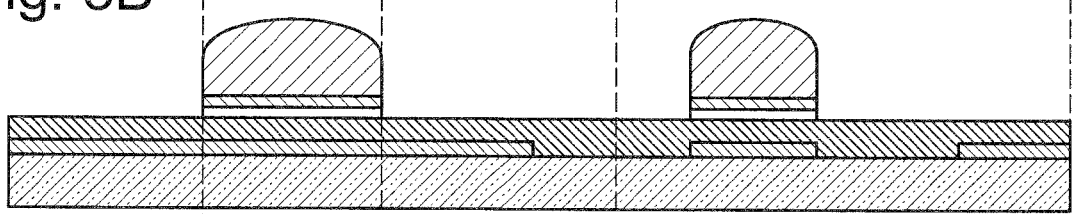
Figure 3C:
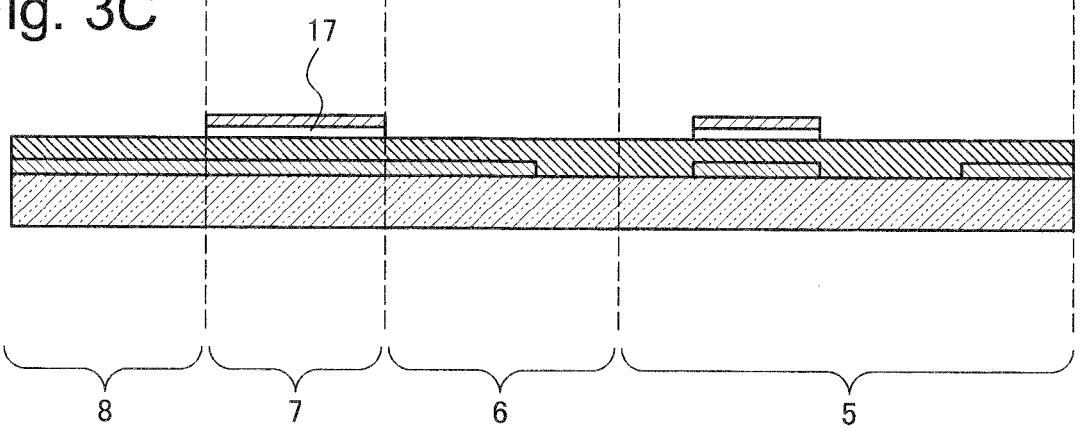

Next, as shown in FIG. 3A, the gate insulating film 10 is formed on the gate wiring 15. A transparent insulating film made of an inorganic material, such as a $SiO_2$ film and a $SiN_x$ film, can be used for the gate insulating film 10. A CVD (Chemical Vapor Deposition) process can be used for deposition thereof. Next, the amorphous silicon (a-Si) film 9 as a channel region and the $n^+$a-Si film 23 as a drain or source contact region are continuously formed on the gate insulating film 10. These films are formed by means of CVD process or the like. After the deposition, a prescribed pattern is formed by etching the films with a patterned resist film 22 using a photolithography process (FIG. 3A, B, C). At the same time, the semiconductor connection layer 17 is formed on the seal portion 7 by using an amorphous silicon (a-Si) film forming a channel region of the TFT (FIG. 3C).

Figure 4A:
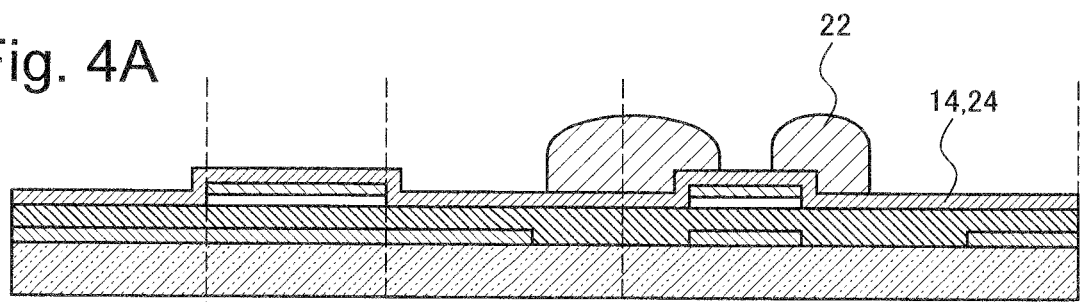
FIGS. 4A to 4C are cross sectional views illustrating a manufacturing process of the TFT substrate according to the first exemplary embodiment of the present invention.
Figure 4B:
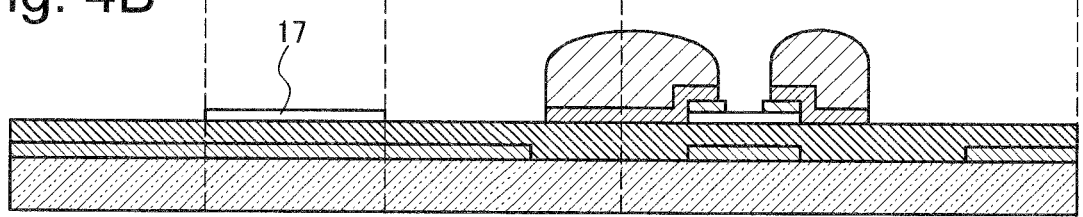
Figure 4C:
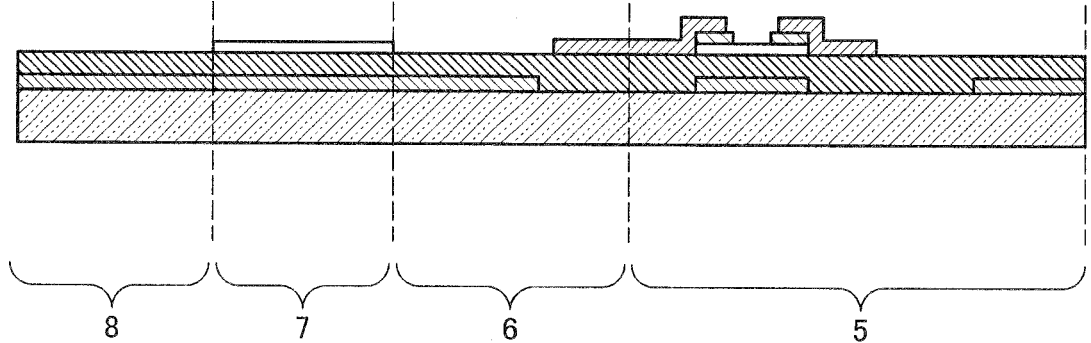

Next, a metallic film as the drain wiring 14 or the source wiring 24 is formed (FIG. 4A). As examples of a metallic film, a pure metal, such as Cr, Al, Mo, Ti and Cu, or an alloy including these metals can be used. A laminated structure consisting of two or more kinds of such metal may be used. A sputtering technique can be preferably used in the process of the metallic film deposition as well as the gate wiring formation. A TFT pattern is formed by using a resist film 22 as a mask by means of a photolithography process. A drain region and a source region are separated by a channel etching process (FIG. 4B). As a result, an inverted-staggered type TFT structure is completed (FIG. 4C). It is preferable to perform the channel etching by means of a dry etching process. Although FIG. 4 shows the manufacturing process in which the channel etching is performed before removing the resist film 22, it may be also performed after removing the resist.

Figure 5A:
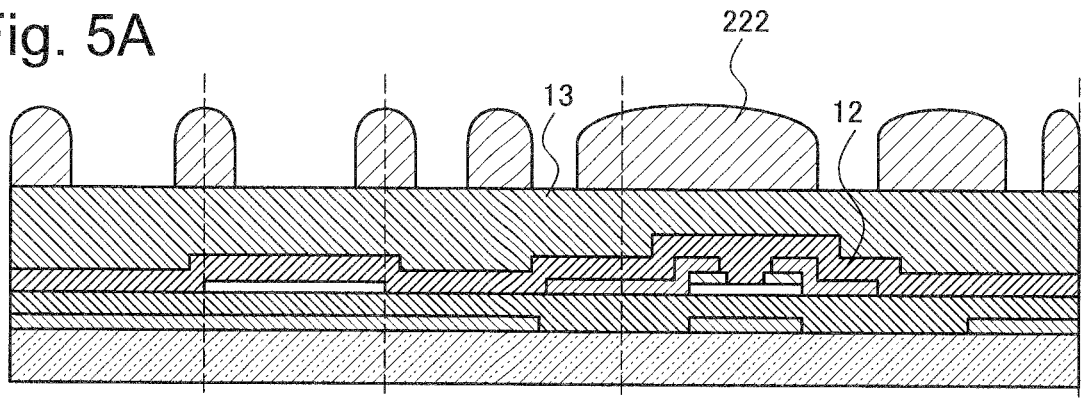
FIGS. 5A to 5C are cross sectional views illustrating a manufacturing process of the TFT substrate according to the first exemplary embodiment of the present invention.

Next, as shown in FIG. 5, after forming the drain wiring 14 and the source wiring 24, the protective insulating film 12 is formed thereon. A transparent insulating film including an inorganic material or an organic material can be used as the protective insulating film 12. In this exemplary embodiment, the inorganic protective insulating film 12 made of a $SiN_x$ film is formed by the CVD process. Next, the organic interlayer insulating film 13 is formed. As an example of the organic interlayer insulating film 13, an acrylic resin or the like can be used. Next, a resist film 222 on the seal portion 7 and the respective contact regions, which are located in the source electrode 11, the drain wiring 14 connected to the drain electrode and the common electrode 16, is removed by means of a photolithography process (FIG. 5A).

Figure 5B:
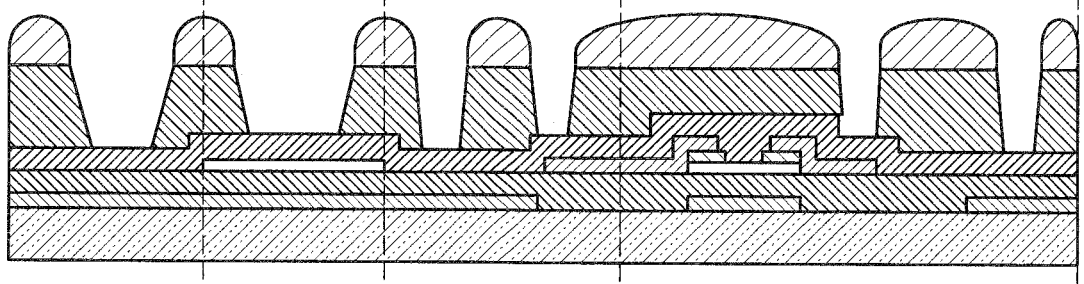
Figure 5C:
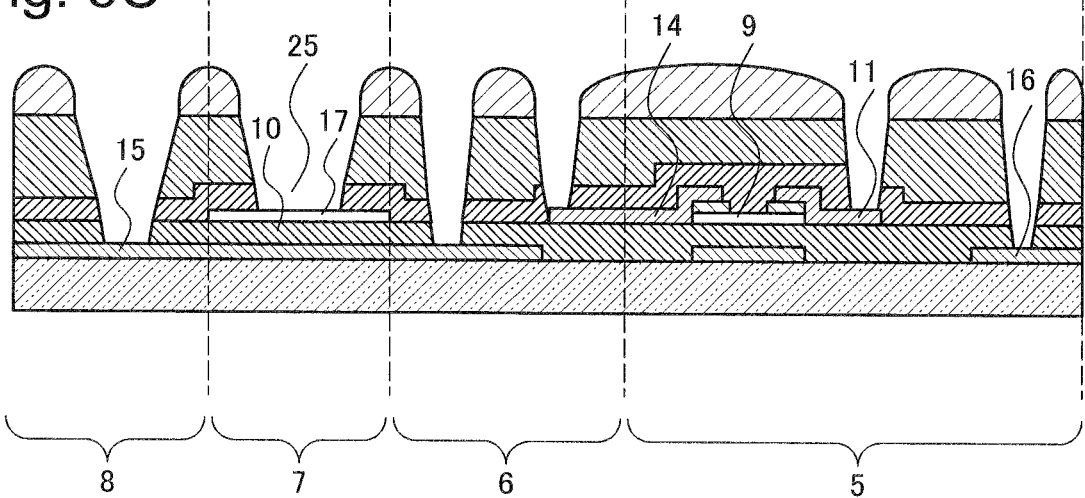

The organic interlayer insulating film 13 is etched by using this resist film 222 as a mask (FIG. 5B). For example, a dry etching with an oxygen ($O_2$) gas can be used for this etching. In order to make the etching rate of the organic interlayer insulating film 13 fast, it is more preferable to etch by using the gas added with a $CF_4$ (tetrafluoromethane) gas. Next, successively, the protective insulating films 12, which are located on the source electrode 11, the drain wiring 14, and the common electrode 16, and the gate insulating film 10 which is located on the common electrode 16 are removed by means of etching process (FIG. 5C). For example, the etching process is performed by means of a dry etching with a $CF_4$ gas or an $SF_6$ (sulfur hexafluoride) gas. The protective insulating film 12 in the seal portion 7 is also removed by the etching process at the same time. However, since the semiconductor connection layer 17 made of an amorphous silicon (a-Si) film is formed under the protective insulating film 12 and functions as an etching stopper, the gate insulating film 10 thereunder is not removed during the etching process (FIG. 5C). That is, in the case of the inverted-staggered type TFT structure, unlike a top gate type (planer type) TFT structure, the amorphous silicon (a-Si) film 9 as the channel region in the TFT is formed on an upper layer of the gate wiring 15. Therefore, the semiconductor connection layer 17 formed in the same layer as the channel region can be used as an etching stopper. By using the above process, the formation of the contact holes which are located on the source electrode 11, the drain wiring 14, and the common electrode 16, and the removal of the organic interlayer insulating film 13 in the seal portion 7 are performed by the same process. The contact holes may include a second contact hole formed on the drain wiring and the source wiring. A fourth contact hole may be formed on the drain wiring and the source wiring.

It is desirable that an area of the semiconductor connection layer 17 formed in the seal portion 7 is larger than an area of an opening 25 which is opened by etching the protective insulating film 12 and the organic interlayer insulating film 13. The reason is as follows. An etching in the horizontal direction progresses by dry etching as well as an etching in the depth direction progressing. For this reason, the area of the opening 25 after etching is larger than the area of the opening 25 which is formed by using the resist film as the mask in early stages of etching. By forming the semiconductor connection layer 17 with the area greater than that of the opening 25 formed by using the resist film, the gate insulating film 10 located under the semiconductor connection layer 17 is not exposed even if side etching progresses during etching the contact hole. Therefore, the gate insulating film 10 is protected by the semiconductor connection layer 17.

Figure 6:
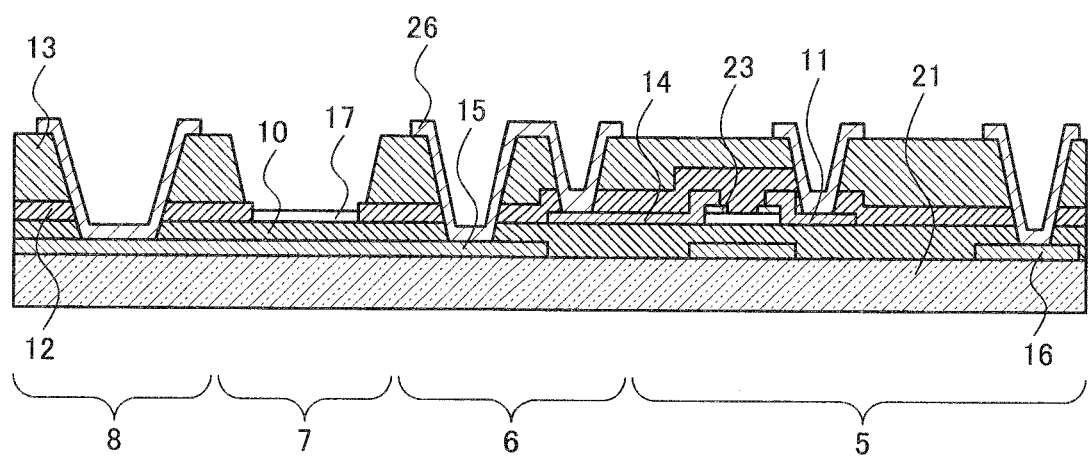
FIG. 6 is a cross sectional view illustrating a manufacturing process of the TFT substrate according to the first exemplary embodiment of the present invention.

Next, as shown in FIG. 6, after forming the contact hole, a transparent conductive film 26 is formed. An indium tin oxide (ITO), an indium zinc oxide (IZO), etc. can be used for the transparent conductive film 26. A sputtering process is preferably used for a deposition process. The transparent conductive film 26 is patterned by using a photomask after deposition, at the same time the transparent conductive film 26 formed in the seal portion 7 is removed Finally, the TFT substrate 2 is completed by forming an alignment film made of a polyimide film, for example.

As mentioned above, according to the manufacturing process of this exemplary embodiment, the semiconductor connection layer 17 functions as an etching stopper. Therefore, the organic interlayer insulating film 13 in the seal portion 7 can be removed by the same process as that of forming the contact holes in the source electrode 11, the drain wiring 14, and the common electrode 16, without adding a new process.

Next, a second exemplary embodiment of the present invention is described. In the second exemplary embodiment, photosensitivity is given to the organic interlayer insulating film 13 used in the first exemplary embodiment. FIG. 7 is a cross sectional view illustrating a manufacturing process of a TFT substrate 2 according to the second exemplary embodiment of the present invention.

Figure 7A:
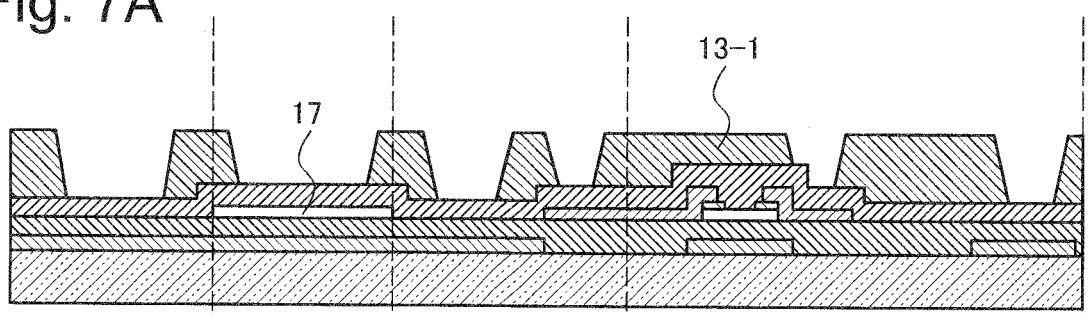
FIGS. 7A and 7B are cross sectional views illustrating a manufacturing process of a TFT substrate according to a second exemplary embodiment of the present invention.

According to the second exemplary embodiment of the present invention, the TFT substrate 2 is formed by the same process as the first exemplary embodiment up to the step for forming the protective insulating film 12. Next, in the process of opening a contact hole, a photosensitive organic interlayer insulating film 13-1 is formed A spin coater or a roll coater, etc. can be used in a coating process. Next, by means of a photolithography process, the organic interlayer insulating film 13-1 is exposed and developed. As a result, the organic interlayer insulating film 13-1, which is formed in the contact hole region and the area for the sealant 18 in the seal portion 7, can be removed without using a resist coating process (FIG. 7A).

Figure 7B:
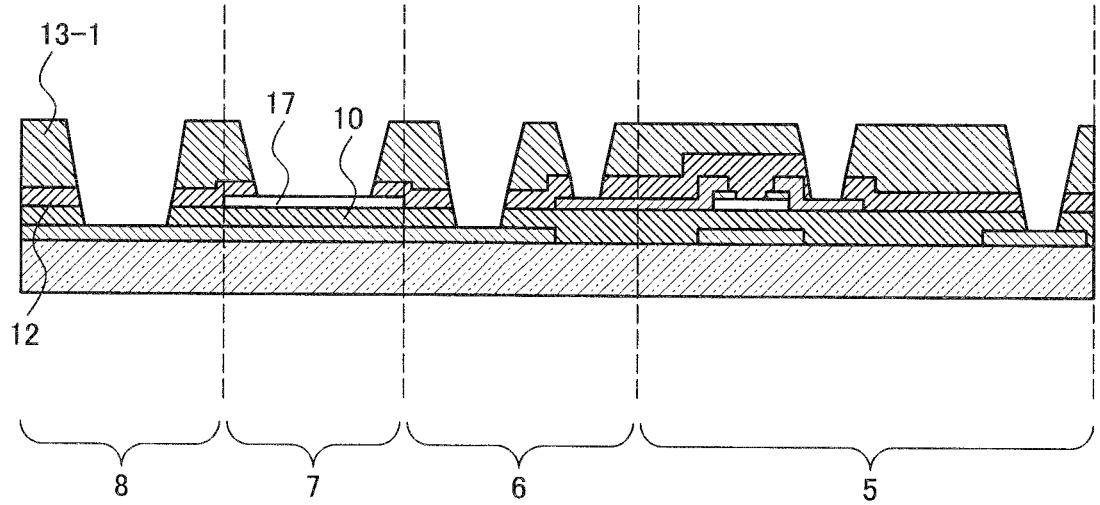

Next, the protective insulating film 12 and the gate insulating film 10 are removed by etching with a mask of the organic interlayer insulating film 13-1 (FIG. 7B). At this time, the protective insulating film 12 on the area for the sealant 18 in the seal portion 7 is removed by this etching process. However, since the semiconductor connection layer 17 made of an amorphous silicon (a-Si) film, which is arranged in the lower layer of the protective insulating film 12 as well as the first exemplary embodiment, functions as an etching stopper, the gate insulating film 10 arranged in the further lower layer is not removed by this etching process. Therefore, according to this exemplary embodiment, the structure, which includes the contact hole region where the gate insulating film 10 is removed and the seal portion 7 covered with the semiconductor connection layer 17 and the gate insulating film 10, can be formed by the process which skips one step for resist film forming process compared with that of the first exemplary embodiment.

Figure 8:
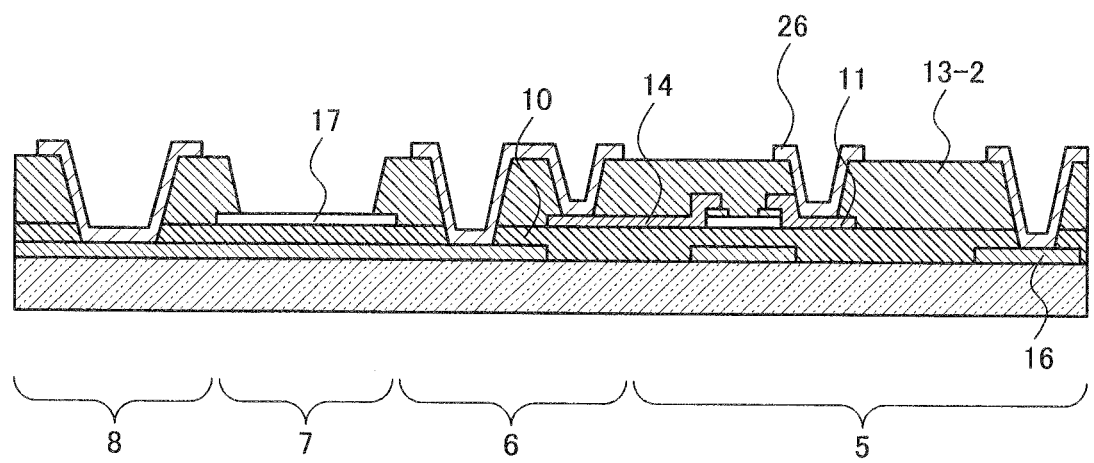
FIG. 8 is a cross sectional view of a TFT substrate according to a third exemplary embodiment of the present invention.

Next, a third exemplary embodiment of the present invention is described. In the third exemplary embodiment, an organic interlayer insulating film 13-2 is formed instead of the protective insulating film 12 and the organic interlayer insulating film 13 in the first exemplary embodiment. FIG. 8 is a cross sectional view of a TFT substrate 2 according to the third exemplary embodiment of the present invention. The TFT substrate 2 in this exemplary embodiment is manufactured by the same process as that of the first exemplary embodiment until the step of forming the metallic film which is used as the drain wiring 14 and the source wiring 24. Next, the organic interlayer insulating film 13-2 is formed by a coating process. And in order to open contact holes, the organic interlayer insulating film 13-2 is removed on the region of the source electrode 11, the drain wiring 14, the common electrode 16, and the area for the sealant 18 in the seal portion 7. This process is carried out by means of the conventional photolithography process and etching process by using a resist film as a mask. If the photosensitive organic protective insulating film 13-2 is used, these contact holes can be formed by a photolithography process only. Next, the gate insulating film 10 is removed by means of the dry etching process etc. As a result, by only one step of a photolithography process and an etching process, the opening of the contact holes for the source electrode 11, the drain wiring 14, and the common electrode 16 and the removal of the organic interlayer insulating film 13-2 on the area for the sealant 18 in the seal portion 7 can be carried out. Since the step for forming a protective insulating film 12 made of an inorganic material can be deleted by the above process, an LCD device can be manufactured at much reduced cost.

Next, a fourth exemplary embodiment of the present invention is described. In the fourth exemplary embodiment, the organic interlayer insulating film 13 is removed not only in the seal portion 7 but in the terminal portion 8. FIGS. 9 and 10 are cross sectional views illustrating a manufacturing process of a TFT substrate 2 according to the fourth exemplary embodiment of the present invention.

Figure 9A:
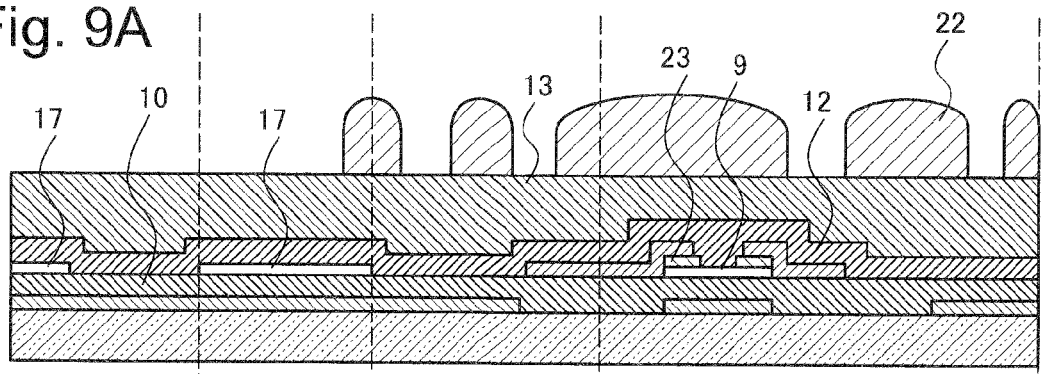
FIGS. 9A to 9C are cross sectional views illustrating a manufacturing process of a TFT substrate according to a fourth exemplary embodiment of the present

As shown in FIG. 9A, an amorphous silicon (a-Si) film 9 as a channel region and an $n^+$a-Si film 23 as a contact region of a drain and a source in the TFT are formed by means of the same process as that of the first exemplary embodiment. At this time, the semiconductor connection layer 17 made of an amorphous silicon (a-Si) film is formed not only in the seal portion 7 but in the terminal portion 8 in this exemplary embodiment. It is desirable that a part of the semiconductor connection layer 17 which extends to the display area (pixel) side from the seal portion 7 is arranged in the region where the organic interlayer insulating film 13 and the protective insulating film 12 are partially overlapped after etched. It is because an influence of a side etching can be prevented which arises in the etching step of the organic interlayer insulating film 13 as mentioned later.

Figure 9B:
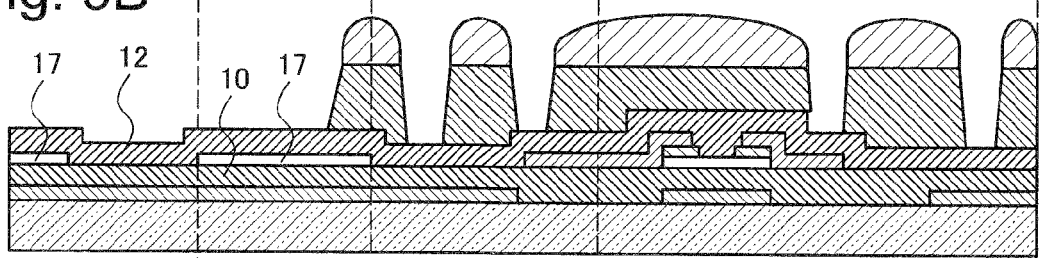
Figure 9C:
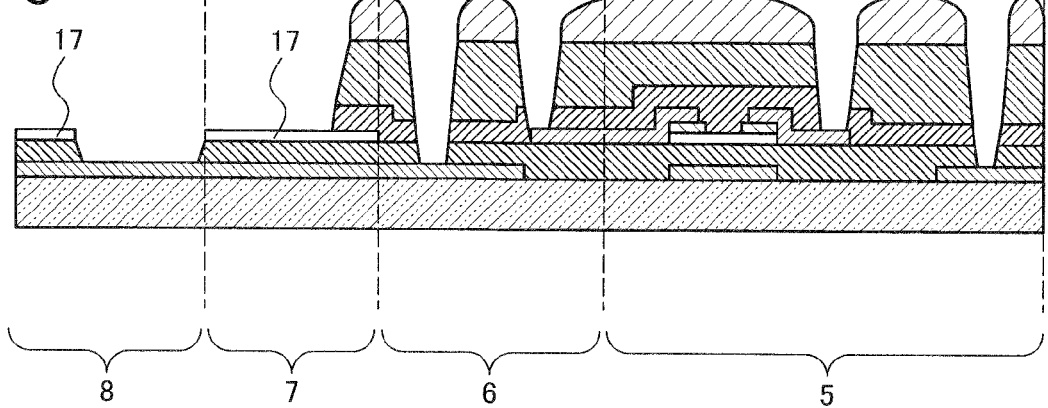
Figure 11A:
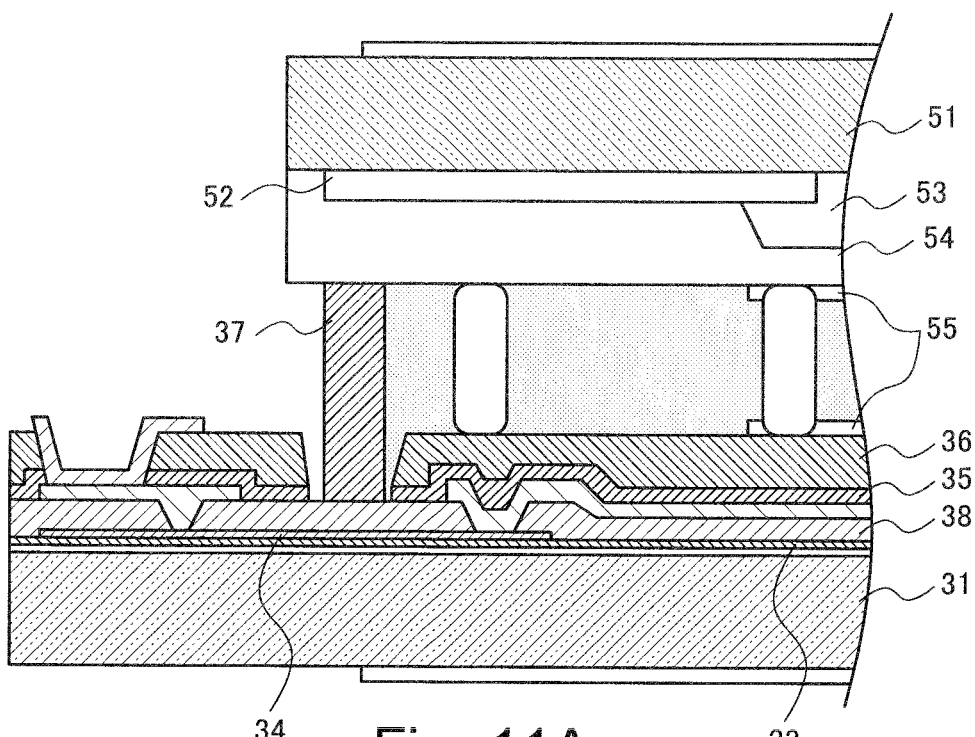
FIGS. 11A and 11B are cross sectional views of an LCD device of a related art of the present invention.
Figure 11B:
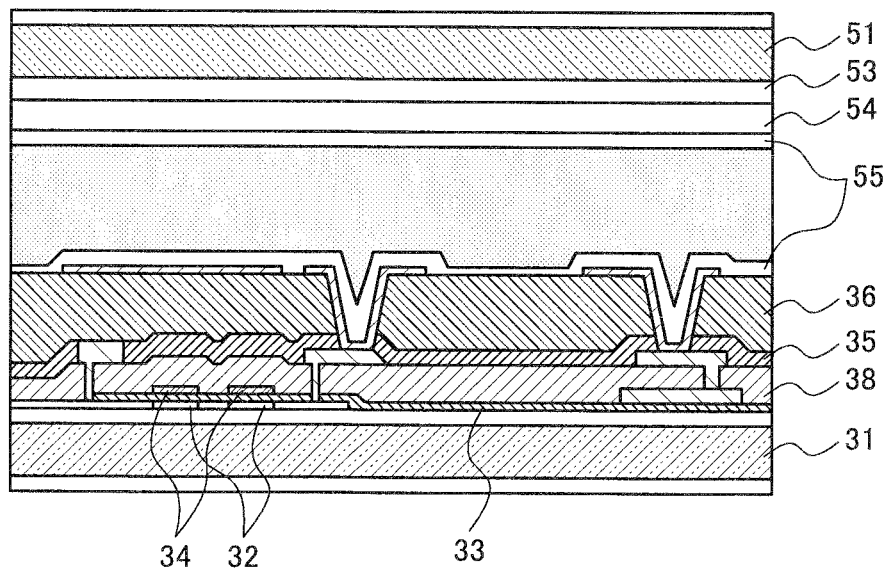
Figure 12A:
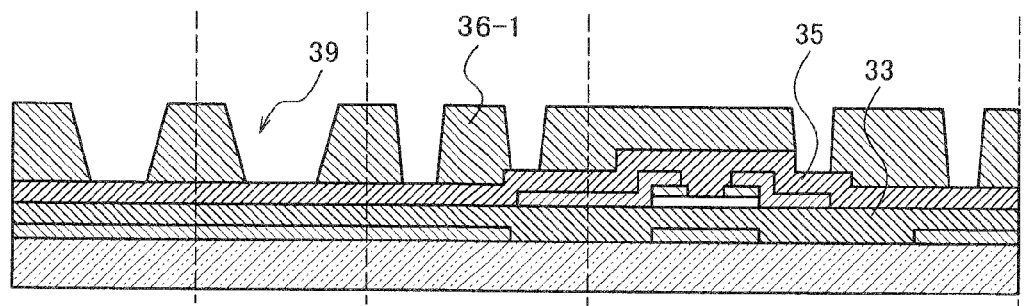
FIGS. 12A to 12D are cross sectional views illustrating a manufacturing process of a TFT substrate of a related art of the present invention.
Figure 12B:
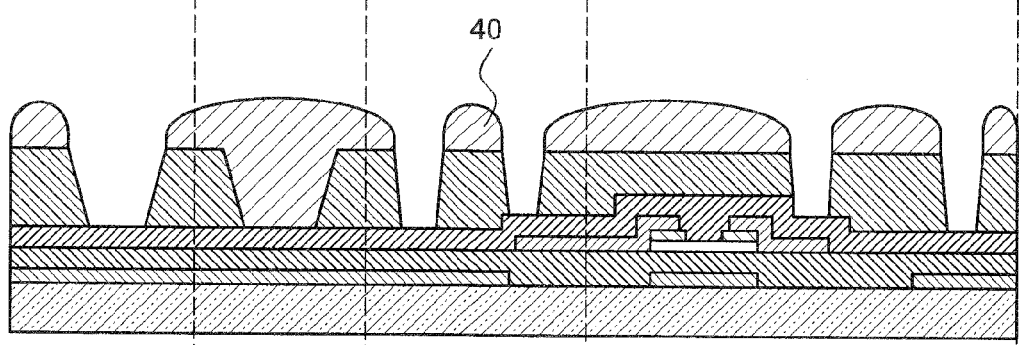
Figure 12C:
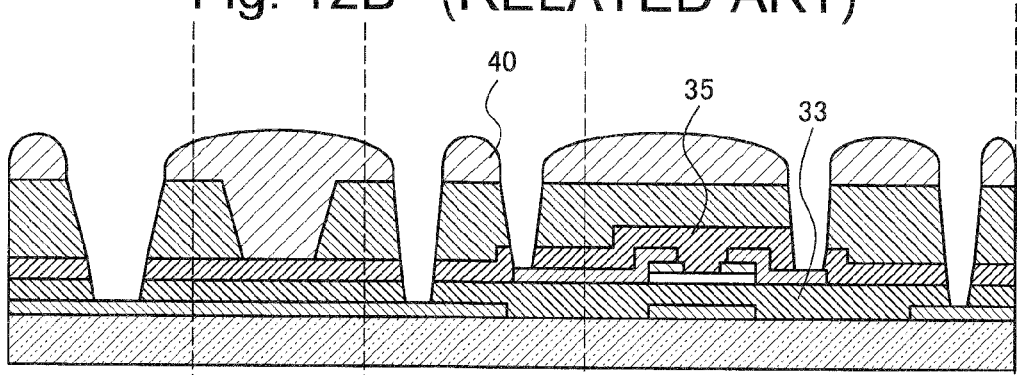
Figure 12D:
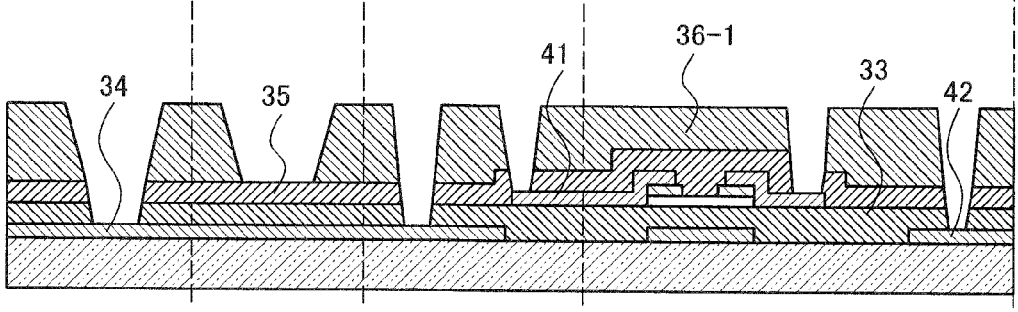

Next, the resist film 22 is formed into a prescribed pattern by means of a photolithography process, and the pattern for TFT is formed by an etching step. Next, up to the step for coating the organic interlayer insulating film 13, the same steps as those of the first exemplary embodiment are carried out. Next, in order to form contact holes, a resist pattern is formed on the organic interlayer insulating film 13 by means of a photolithography process (FIG. 9A). By using the resist film 22 as a mask, the organic interlayer insulating film 13 is removed along the pattern thereof (FIG. 9B). Next, the protective insulating film 12 and the gate insulating film 10 are removed, then contact holes are formed (FIG. 9C). At that time, the semiconductor connection layer 17 made of an amorphous silicon (a-Si) film arranged in terminal portion 8 and the seal portion 7 is not removed, and functions as an etching stopper for the gate insulating film 10. Therefore, the formation of the contact hole and the removal of the protective insulating film 12 and the organic interlayer insulating film 13 in the seal portion 7 and the terminal portion 8 can be carried out in the same process step.

As mentioned above, the part of the semiconductor connection layer 17 which extends to the display area (pixel) side from the seal portion 7 is arranged in the region where the organic interlayer insulating film 13 and the protective insulating film 12 are partially overlapped. Therefore, even if the side of the protective insulating film 12 and the organic interlayer insulating film 13 recede by the side etching, the gate insulating film 10 arranged under the overlapped region can not be etched.

Next, the semiconductor connection layer 17 in the terminal portion 8 and the seal portion 7 is removed by using the same resist mask (FIG. 10A). The reason is as follows. If an amorphous silicon (a-Si) film is used as the semiconductor connection layer 17, terminals are short-circuited because amorphous silicon (a-Si) film is electrically conductive. In order to avoid such short cut, the semiconductor connection layer 17 in the terminal portion 8 is removed. Finally, a transparent conductive film 26 is formed by the same process as that of the first exemplary embodiment, and then the TFT substrate 2 according to this exemplary embodiment is completed (FIG. 10B).

By using this process, the organic interlayer insulating film 13 can be removed not only in the seal portion 7 but in the terminal portion 8 without adding another photolithography process. Therefore the repair-ability of the terminal portion 8 can be improved. The reason is as follows. An ACF (anisotropic conducting film) connection is generally used for connection between terminals of an LCD device and an external circuit board. In this case, if the organic insulating film remained in the terminal portion, the level difference increases. Therefore the repair-ability deteriorates. However, since the organic insulating film in the terminal portion 8 is also removed according to this exemplary embodiment, the repair-ability of the terminal portion 8 can be improved.

In the seal portion 7 of the TFT substrate 2 according to this exemplary embodiment, the organic interlayer insulating film 13, the protective insulating film 12 made of inorganic material, and the semiconductor connection layer 17 are removed. However, because the sealant 18 adheres to the gate insulating film 10 made of inorganic material, strong adhesive strength thereof can be obtained.

In this exemplary embodiment, the organic interlayer insulating film 13 may have photosensitivity as well as in the second exemplary embodiment, and the organic interlayer insulating film 13-1 may be patterned by a photolithography process. The organic interlayer insulating film 13-2 consisting of one layer may be used instead of using both the protective insulating film 12 and the organic interlayer insulating film 13 as well as in the third exemplary embodiment.

Next, a manufacturing process of a related LCD device having an organic interlayer insulating film is described referring to FIG. 12. The related LCD device is provided with an inverted-staggered type TFT. First, a photosensitive organic interlayer insulating film 36-1 is coated on the whole surface of the protective insulating film 35 made of an inorganic material. Then, a contact hole and an opening 39 corresponding to a pattern of a seal portion 7 are formed in the organic interlayer insulating film 36-1 by means of the first photolithography step (FIG. 12A). Next, a resist film is coated on the whole surface of the organic interlayer insulating film 36-1 so that the opening 39 may be buried. Next, a resist film 40 is patterned by means of the second photolithography step so that the opening 39 in a seal portion 7 may be covered (FIG. 12B). The protective insulating film 35 and a gate insulating film 33 in a contact hole region are removed in a step for etching by using the resist film 40 as a mask (FIG. 12C). Finally, the resist film is stripped (FIG. 12D).

However, in the related LCD device mentioned above, as shown in FIG. 12D, the organic interlayer insulating film 36-1, the protective insulating film 35, and the gate insulating film 33 must be removed in order to form the contact hole for the drain wiring 41 connected to the drain electrode provided on the gate insulating film 33, and the contact hole for the common electrode 42 provided on the same layer as the gate wiring 34. If the organic interlayer insulating film 36-1 in the seal portion is removed by the same process, the protective insulating film 35 and the gate insulating film 33 in the seal portion will be removed as well as the organic interlayer insulating film 36-1. As a result, the gate wiring 34 can be exposed in the seal portion.

Therefore, in the related LCD device, there is the problem that the wiring material which composes gate wiring 34 is corroded by contacting the sealant. Since impurities penetrate the liquid crystal layer by the corrosion, there are problems that display failure has arisen, and the adhesiveness between the sealant and the metallic wiring has deteriorated.

In order to avoid these problems, as described with FIG. 12, it is necessary that the process for forming the contact hole and the process for forming the seal portion with the gate insulating film 33 remaining are separately performed. Therefore, since it is necessary to perform two times of photolithography processes there are the problems that the number of processes increases and a manufacturing cost rises.

An exemplary advantage according to the invention is that an increase in the number of processes can be controlled because the step for forming the contact hole in the TFT substrate and the step for opening the organic interlayer insulating film in the seal portion can be performed at the same process. A high reliable LCD device having strong adhesive force between a TFT substrate and a sealant can be obtained.

While the invention has been particularly shown and described with reference to exemplary embodiments thereof the invention is not limited to these embodiments. It will be understood by those of ordinary skill in the art that various changes in form and details may be made therein without departing from the spirit and scope of the present invention as defined by the claims.

Further, it is the inventor's intention to retain all equivalents of the claimed invention even if the claims are amended during prosecution.

What is claimed is:

1. A manufacturing process of a liquid crystal display device, comprising:
   forming a first substrate provided with a pixel part with thin film transistors and a seal portion arranged around said pixel part;
   forming a second substrate opposed to said first substrate;
   filling a liquid crystal layer between said first substrate and said second substrate; and
   adhering said first substrate to said second substrate with a sealant provided for said seal portion,
   wherein said forming said first substrate comprises:
   forming a semiconductor layer composing said thin film transistor, forming in said seal portion a semiconductor connection layer made of a same material as said semiconductor layer, and forming an organic interlayer insulating film;
      wherein said forming said semiconductor layer and said forming said semiconductor connection layer are performed in the same step, and said first substrate comprises at least the organic interlayer insulating film, said seal portion comprises the semiconductor connection layer which made of a same material as the semiconductor layer composing said thin film transistor, and said sealant is placed on a bottom of an opening between a terminal portion and a Gate wiring/Drain wiring conversion portion from where said semiconductor connection layer reveals and is surrounded by a protective insulating film, the organic interlayer insulating film and a transparent conductive film.

2. The manufacturing process of a liquid crystal display device according to claim 1, wherein said seal portion comprises a gate wiring connected to a gate electrode of said thin film transistor, a gate insulating film formed on said gate wiring, said semiconductor connection layer formed on said gate insulating film, and said organic interlayer insulating film, wherein said forming said first substrate further comprises removing said gate insulating film in regions except said seal portion, and forming an opening where said semiconductor connection layer is exposed in a part of said organic interlayer insulating film in said seal portion, wherein said semiconductor connection layer is used as an etching mask in removing said gate insulating film.

3. The manufacturing process of a liquid crystal display device according to claim 1, wherein said first substrate comprises a gate wiring connected to a gate electrode of said thin film transistor, a common electrode made of a same material as said gate wiring, a gate insulating film formed on said gate wiring and said common electrode, said semiconductor layer formed on said gate insulating film, a drain wiring and a source wiring which are connected to a drain electrode and a source electrode of said thin film transistor, respectively, and said organic interlayer insulating film formed on said drain wiring and said source wiring,
   wherein said forming said first substrate further comprises forming a first contact hole by removing a part of said gate insulating film and said organic interlayer insulating film on said common electrode, forming a second contact hole by removing a part of said organic interlayer insulating film on said drain wiring and said source wiring, and forming an opening where said semiconductor connection layer is exposed by removing said organic interlayer insulating film in said seal portion,
   wherein said forming said first contact hole, said forming said second contact hole, and said forming said opening are performed in the same photolithography step and etching step.

4. The manufacturing process of a liquid crystal display device according to claim 1, wherein said first substrate comprises a gate wiring connected to a gate electrode of said thin film transistor, a common electrode made of a same material as said gate wiring, a gate insulating film formed on said gate wiring and said common electrode, said semiconductor layer formed on said gate insulating film, a drain wiring and a source wiring which are connected to a drain electrode and a source electrode of said thin film transistor, respectively, a protective insulating film formed on said drain wiring and said source wiring, and said organic interlayer insulating film formed on said protective insulating film,
   wherein said forming said first substrate further comprises forming a third contact hole by removing a part of said gate insulating film, said protective insulating film, and said organic interlayer insulating film on said common electrode, respectively, forming a fourth contact hole by removing a part of said protective insulating film and said organic interlayer insulating film on said drain wiring and said source wiring, and forming an opening where said semiconductor connection layer is exposed by removing said organic interlayer insulating film and said protective insulating film in said seal portion,
   wherein said forming said third contact hole, said forming said fourth contact hole, and said forming said opening are performed in the same photolithography step and etching step.

5. The manufacturing process of a liquid crystal display device according to claim 2, wherein said forming said opening comprises forming an etching mask on said organic interlayer insulating film, forming a mask pattern having a mask opening region removed a part of said etching mask, and removing a part of said organic interlayer insulating film by using said mask pattern,
   wherein a region, where said mask opening region is projected on a surface of said semiconductor connection layer, is surrounded by said semiconductor connection layer.

6. The manufacturing process of a liquid crystal display device according to claim 1, wherein said forming said organic interlayer insulating film comprises a photolithography step using a photosensitive organic interlayer insulating film material.

7. The manufacturing process of a liquid crystal display device according to claim 1, wherein said first substrate comprises a terminal portion outside of said seal portion, said terminal portion is connected to said pixel part by a lead wiring crossing said seal portion,
wherein said forming said first substrate further comprises forming said semiconductor connection layer in said terminal portion, and said forming said semiconductor connection layer in said seal portion and said forming said semiconductor connection layer in said terminal portion are performed in the same step.

8. A liquid crystal display device, comprising:
a first substrate provided with a pixel part with thin film transistors and a seal portion arranged around said pixel part on a same surface of said first substrate;
a second substrate opposed to said first substrate;
a liquid crystal layer filled between said first substrate and said second substrate; and
a sealant provided for said seal portion in which said first substrate is adhered to said second substrate, wherein said first substrate comprises at least an organic interlayer insulating film, said seal portion comprises a semiconductor connection layer which is made of a same material as a semiconductor layer composing said thin film transistor, and said sealant is placed on a bottom of an opening between a terminal portion and a Gate wiring/Drain wiring conversion portion from where said semiconductor connection layer reveals and is surrounded by a protective insulating film, an organic interlayer insulating film and a transparent conductive film.

9. The liquid crystal display device according to claim 8, wherein said seal portion comprises the gate wiring connected to a gate electrode of said thin film transistor, a gate insulating film formed on said gate wiring, said semiconductor connection layer formed on said gate insulating film, said organic interlayer insulating film, and the opening in which said semiconductor connection layer is exposed in a part of said organic interlayer insulating film.

10. The liquid crystal display device according to claim 8, wherein said first substrate comprises the gate wiring connected to a gate electrode of said thin film transistor, a common electrode made of a same material as said gate wiring, a gate insulating film formed on said gate wiring and said common electrode, said semiconductor layer formed on said gate insulating film, a drain wiring and a source wiring which are connected to a drain electrode and a source electrode of said thin film transistor, respectively, said organic interlayer insulating film formed on said drain wiring and said source wiring,
a first contact hole formed on said common electrode by removing a part of said gate insulating film and said organic interlayer insulating film, and
a second contact hole formed on said drain wiring or said source wiring by removing a part of said organic interlayer insulating film.

11. The liquid crystal display device according to claim 8, wherein said first substrate comprises the gate wiring connected to a gate electrode of said thin film transistor, a common electrode made of a same material as said gate wiring, a gate insulating film formed on said gate wiring and said common electrode, said semiconductor layer formed on said gate insulating film, a drain wiring and a source wiring which are connected to a drain electrode and a source electrode of said thin film transistor, respectively, a protective insulating film formed on said drain wiring and said source wiring, said organic interlayer insulating film formed on said protective insulating film,
a first contact hole formed on said common electrode by removing a part of said gate insulating film, said protective insulating film, and said organic interlayer insulating film, and
a second contact hole formed on said drain wiring or said source wiring by removing a part of said protective insulating film and said organic interlayer insulating film.

12. The liquid crystal display device according to claim 9, wherein said semiconductor connection layer is exposed in whole region of said opening and an area of said opening is smaller than that of said semiconductor connection layer.

13. The liquid crystal display device according to claim 8, wherein the sealant is formed from epoxy resin.

14. The liquid crystal display device according to claim 8, wherein semiconductor connection layer is formed from amorphous silicon.

15. The liquid crystal display device according to claim 8, wherein the seal portion is located near a periphery of the first substrate.

16. The liquid crystal display device according to claim 8, wherein the sealant is formed from epoxy resin, and the semiconductor connection layer is formed from an amorphous silicon film in a region adhering to the sealant so that adhesive force between the sealant and the first substrate is strengthened.

17. The liquid crystal display device according to claim 8, wherein the same material is amorphous silicon.

18. The liquid crystal display device according to claim 8, wherein semiconductor connection layer is formed from amorphous silicon film forming a channel region of the thin film transistor.

19. A liquid crystal display device, comprising:
a first substrate provided with a pixel part where thin film transistors are formed and a seal portion arranged around said pixel part; a second substrate opposed to said first substrate; a liquid crystal layer filled between said first substrate and said second substrate; and a sealant provided for said seal portion in which said first substrate is adhered to said second substrate, wherein said first substrate comprises at least an organic interlayer insulating film and a terminal portion arranged outside of said seal portion, said seal portion comprises a gate wiring connected to a gate electrode of said thin film transistors and a gate insulating film formed on said gate wiring, and said gate insulating film in said seal portion is arranged in contact with said sealant,
wherein said sealant is placed on a semiconductor connection layer made of a same material as a semiconductor layer composing said thin film transistors between said terminal portion and a Gate wiring/Drain wiring conversion portion and is surrounded by a protective film, an organic interlayer insulating film and a transparent conductive film, said semiconductor connection layer lying between said gate insulating film and said protective film partially extends underneath said protective film and there exists a part where said protective film and said gate insulating film directly contact with each other in said seal portion, and said sealant is placed on a surface revealing said gate insulating film in said seal portion.

* * * * *